(12) United States Patent
Yoon et al.

(10) Patent No.: US 8,587,007 B2
(45) Date of Patent: Nov. 19, 2013

(54) LIGHT EMITTING DEVICE

(75) Inventors: Hosang Yoon, Seoul (KR); Daesung Kang, Seoul (KR); Jinsoo Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 132 days.

(21) Appl. No.: 13/172,277

(22) Filed: Jun. 29, 2011

(65) Prior Publication Data

US 2011/0316004 A1 Dec. 29, 2011

(30) Foreign Application Priority Data

Jun. 29, 2010 (KR) .................. 10-2010-0062138
Oct. 27, 2010 (KR) .................. 10-2010-0105400

(51) Int. Cl.
*H01L 33/00* (2010.01)

(52) U.S. Cl.
USPC ............................ 257/98; 257/99; 257/103

(58) Field of Classification Search
USPC ............................................. 257/98, 99, 103
See application file for complete search history.

(56) References Cited

U.S. PATENT DOCUMENTS

2009/0032835 A1* 2/2009 Park ........................... 257/103
2009/0283795 A1* 11/2009 Miki et al. ................. 257/103
2010/0102353 A1* 4/2010 Park ............................ 257/98

* cited by examiner

*Primary Examiner* — Tan N Tran
(74) *Attorney, Agent, or Firm* — Birch, Stewart, Kolasch & Birch, LLP

(57) ABSTRACT

The embodiment relates to a light emitting device and a method for manufacturing the same. The light emitting device includes a substrate, a plurality of convex portions protruding from a flat top surface of the substrate, a first semiconductor layer on the substrate, an active layer on the first semiconductor layer, and a second conductive semiconductor layer on the active layer. A circumferential surface of each convex portion includes a continuous spherical surface, and a height of the convex portion is about 1.5 μm or less.

20 Claims, 12 Drawing Sheets

LIGHT EMITTING DEVICE

CROSS-REFERENCE TO RELATED APPLICATIONS

The present application claims priority under 35 U.S.C. §119(a) of Korean Patent Application No. 10-2010-0062138 filed on Jun. 29, 2010 and No 10-2010-0105400 filed on Oct. 27, 2010, which is hereby incorporated by reference in its entirety.

BACKGROUND

The embodiment relates to a light emitting device.

A light emitting device (LED) includes a p-n junction diode having a characteristic of converting electric energy into light energy. The p-n junction diode can be formed by combining group III and group V elements of the periodic table. The LED can represent various colors by adjusting the compositional ratio of compound semiconductors.

When forward voltage is applied to the LED, electrons of an n-type layer are combined with holes of a p-type layer, so that energy corresponding to an energy gap between a conduction band and a valance band may be generated.

In particular, blue, green, red and UV light emitting devices employing the nitride semiconductor have already been developed and extensively used.

SUMMARY

The embodiment provides a light emitting device including a plurality of convex portions protruding from a transmissive substrate and having a circumferential surface formed as a continuous spherical surface.

The embodiment provides a light emitting device having a plurality of convex portions having a spherical surface on a substrate.

The embodiment provides a light emitting device having a structure in which low current and ESD characteristics can be easily improved.

The embodiment provides a light emitting device capable of improving light emission efficiency, a method for manufacturing the same, and a light emitting device package.

According to the embodiment, the light emitting device includes a substrate, a plurality of convex portions protruding from a flat top surface of the substrate, a first semiconductor layer on the substrate, an active layer on the first semiconductor layer, and a second conductive semiconductor layer on the active layer. A circumferential surface of each convex portion includes a continuous spherical surface, and a height of the convex portion is about 1.5 µm or less.

According to the embodiment, a light emitting device includes a substrate having a flat top surface and a plurality of convex portions protruding more than the flat top surface, a buffer layer on the flat top surface between the convex portions of the substrate, a first semiconductor layer on the buffer layer and the convex portions, an active layer on the first semiconductor layer, and a second conductive semiconductor layer on the active layer. A circumferential surface of each convex portion includes a continuous curved surface, and the first semiconductor layer includes a plurality of dislocations having an interval greater than an interval between the convex portions.

According to the embodiment, a light emitting device includes a substrate having a flat top surface and a plurality of convex portions protruding more than the flat top surface, a buffer layer on the flat top surface of the substrate, a first semiconductor layer on the buffer layer and the convex portion, an active layer on the first semiconductor layer, and a second conductive semiconductor layer on the active layer. A circumferential surface of each convex portion includes a continuously rounded surface, and a height difference of the rounded surface of the convex portion is calculated by a following equation, $$\text{Rise}(B) = R(\text{Radius}) \times \left(1 - \cos\left[\frac{\left(\frac{C(\text{Chord})}{2}\right)}{R(\text{Radius})}\right]\right) \quad \text{Equation}$$

in which the R represents a radius of a circle having the rounded surface, the C represents a length of a chord of the rounded surface, and the B represents a height difference between a virtual line linking a vertex of the convex portion with a lower end of the convex portion and the rounded surface.

DETAILED DESCRIPTION OF THE EMBODIMENTS

Figure 1:
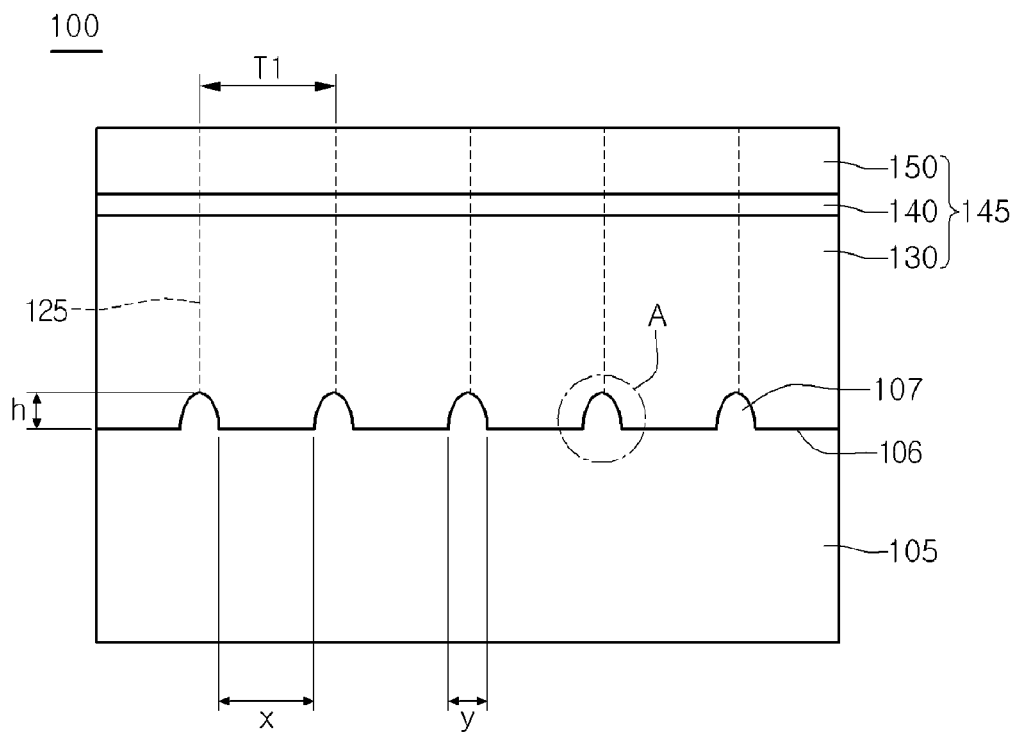
FIG. 1 is a side sectional view showing a light emitting device according a first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting device according to the embodiments will be described with reference to accompanying drawings.

Figure 2:
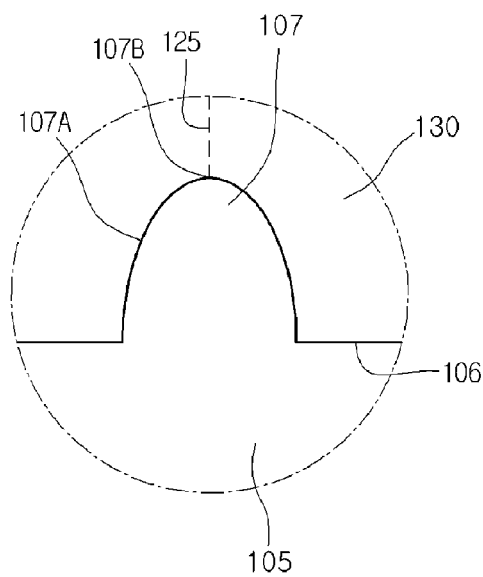
FIG. 2 is a detailed view showing a convex portion on a substrate of FIG. 1.
Figure 3:
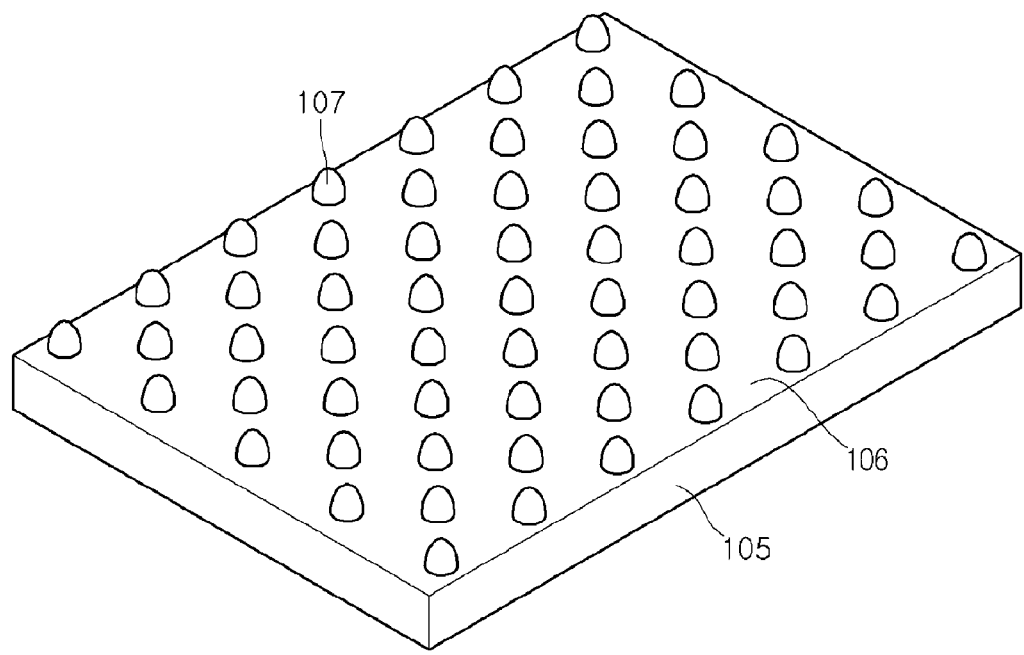
FIG. 3 is a perspective view showing the substrate of FIG. 1.

FIG. 1 is a side sectional view showing a light emitting device 100 according to the embodiment, and FIG. 2 is an enlarged view showing a region A of FIG. 1, FIG. 3 is a view showing a substrate 105 of the light emitting device 100 according to the embodiment.

Referring to FIGS. 1 to 3, the light emitting device 100 according to the embodiment includes the substrate 105 including a plurality of convex portions 107, and a first semiconductor layer 130, an active layer 140, and a second conductive semiconductor layer 150 on the substrate 105.

The substrate 105 may include a transmissive substrate, an insulating substrate, and a conductive substrate. The substrate 105 may include at least one selected from the group consisting of sapphire ($Al_2O_3$), SiC, GaAs, GaN, ZnO, Si, GaP, InP, $Ga_2O_3$ and Ge. The substrate 105 may include $Al_2O_3$, but the embodiment is not limited thereto.

The convex portions 107 protrude from a flat top surface 106 of the substrate 105. The convex portions 107 can change the critical angle of a light incident thereon to improve the light extraction efficiency of the light emitting device 100.

The height h of each convex portion 107 is in the range of about 0.5 μm to about 1.5 μm, preferably, in the range of about 0.5 μm to about 1.1 μm. The width y of each convex portion 107 may be in the range of about 0.5 μm to about 1.5 μm, preferably, in the range of about 0.5 μm to about 1 μm. The width y of each convex portion 107 may differ from the height h of each convex portion 107. For example, the width y of the convex portion 107 may be greater than the height h of the convex portion 107. The interval x between adjacent convex portions 107 is in the range of about 2.0 μm to about 3.0 μm, preferably, in the range of about 2.0 μm to about 2.5 μm.

According to the embodiment, due to the convex portions 107 having the above height h, width y, and interval x, a semiconductor layers 130, 140, and 150 having superior crystalline can be grown on the substrate 105.

Referring to FIGS. 1 and 2, if each convex portion 107 has the height h, the width y, and the interval x, a circumferential surface 107A of the convex portion 107 may be curved. In other words, in the light emitting device 100 according to the embodiment, since the circumferential surface 107A of each convex portion 107 is curved, growth planes of the semiconductor layers 130, 140, and 150 are grown from the flat top surface 106 of the substrate 105. Therefore, the lower surface of the first semiconductor layer 130 may include a discontinuous surface by the convex portions 107.

In more detail, in the case of the substrate including $Al_2O_3$, a plurality of convex portions are formed by an etching process, and discontinuous surfaces are created on the convex portions of the $Al_2O_3$ substrate cleavage planes. The flat top surface of the $Al_2O_3$ substrate and the discontinuous surfaces of the convex portions are used as different growth planes for the semiconductor layers. Accordingly, the semiconductor layers 130, 140, and 150 constituting a light emitting structure are grown along the flat top surface 106 of the sapphire substrate and the discontinuous surfaces of the convex portion. If a plurality of growth planes of the semiconductor layers exist as described above, the semiconductor layers are grown in various growing directions, and a plurality of merge pits may be formed on the surface of the semiconductor layer. Since the merge pit passes through the active layer, the merge pit exerts an influence on internal quantum efficiency, and may be used as an abnormal current path.

The flat top surface 106 of the substrate 105 becomes a growth plane. Since the circumference of the convex portion 107 is continuously curved, the circumference of the convex portion 107 may not serve as the growth plane.

In the convex portion 107, a vertex region 107B may have a discontinuous surface, and the circumferential surface 107A except for the vertex region 107B may have a continuous curved surface. The circumferential surface 107A of the convex portion 107 may have a conical shape in which the circumferential surface 107A is curved by at least 95% of the height h of the convex portion 107 is curved. In addition, the convex portion 107 may have a semispherical shape or a dome shape in which the whole surface is curved, but the embodiment is not limited thereto.

In the light emitting device 100 according to the embodiment, the convex portions 107 have the above height h, width y, and interval x, and have discontinuous curved surface, so that the light emission efficiency of the light emitting device 100 can be improved.

Each of the convex portions 107 has a semispherical shape, a dome shape, or a conical shape as shown in FIGS. 2 and 3, but the embodiment is not limited thereto. In other words, the convex portions 107 may have various shapes without discontinuous circumferential surface. The convex portions 107 may be arranged in a zig-zag pattern, but the embodiment is not limited.

The first semiconductor layer 130 may be formed on the substrate 105. The first semiconductor layer 130 may include a group III-V compound semiconductor layer, for example, a semiconductor material having a compositional formula of $In_xAl_yGa_{1-x-y}N$ ($0 \le x \le 1$, $0 \le y \le 1$, and $0 \le x+y \le 1$). The first semiconductor layer 130 may include a material selected from the group consisting of GaN, AlN, AlGaN, InGaN, InN, InAlGaN, AlInN, AlGaAs, GaP, GaAs, GaAsP, and AlGaInP.

The first semiconductor layer 130 may include at least one of a buffer layer, an undoped semiconductor layer, and a first conductive semiconductor layer. The buffer layer is a semiconductor layer used to reduce a lattice constant difference between the substrate 105 and a nitride semiconductor layer. The undoped semiconductor layer is a layer which is not doped with dopants in order to improve the crystalline. The undoped semiconductor layer may have dopant concentration lower than that of a first conductive semiconductor layer. The first conductive semiconductor layer may have the polarity opposite to that of the second conductive semiconductor layer 150.

The first semiconductor layer 130, the active layer 140, and the second conductive semiconductor layer 150 may be defined as a light emitting structure 145, but the light emitting structure 145 is not limited thereto. The light emitting structure 145 includes a first conductive semiconductor layer.

The light emitting structure 145 may include a group III-V compound semiconductor, for example, may include a compound semiconductor material selected from the group consisting of GaN, AlN, AlGaN, InGaN, InN, InAlGaN, AlInN, AlGaAs, GaP, GaAs, GaAsP, and AlGaInP. Electrons and holes supplied from the first semiconductor layer 130 and the second conductive semiconductor layers 150 are recombined with each other in the active layer 140, thereby generating a light.

The first semiconductor layer 130 may include a semiconductor material having a compositional formula of $In_xAl_yGa_{1-x-y}N$ ($0 \leq x \leq 1$, $0 \leq y \leq 1$, and $0 \leq x+y \leq 1$). The first semiconductor layer 130 may include a compound semiconductor of a group III-V element doped with first conductive dopants, for example, may include a material selected from the group consisting of GaN, AlN, AlGaN, InGaN, InN, InAlGaN, AlInN, AlGaAs, GaP, GaAs, GaAsP, and AlGaInP. If the first semiconductor layer 130 is an N type semiconductor layer, the first conductive dopants may include N type dopants such as Si, Ge, Sn, Se, and Te. In addition, the first semiconductor layer 130 may have a single layer structure or a multi-layer structure.

The first semiconductor layer 130 is provided therein with dislocations 125 generated from vertex regions 107B of the convex portions 107, and the dislocation 125 may be generated from at least one of the convex portions 107. The interval T1 between the dislocations 125 may be a period between the convex portions 107 or the interval between the vertex regions 107B of the convex portions 107. The dislocation 125 provided in the first semiconductor layer 130 may correspond to the vertex region 107B of the convex portion 107 rather than the flat top surface 106 of the substrate 105. In other words, in the first semiconductor layer 130, the dislocation 125 may be not generated at a region corresponding to the curved surface region except for the vertex region 107B of the convex portion 107. In the first semiconductor layer 130, the region corresponding to the top surface portion 106 of the substrate 105 may be a region in which the dislocation 125 exists or not.

The dislocation 125 may be transferred to the second conductive semiconductor layer 150 through the active layer 140, but the embodiment is not limited thereto. The dislocation 125 may be formed in a thickness direction (that is, vertical direction) of the first semiconductor layer 130, or may be formed in the mixture of vertical and horizontal directions.

The active layer 140 may be formed on the first semiconductor layer 130. The active layer 140 may include a semiconductor material having a compositional formula of $In_xAl_yGa_{1-x-y}N$ ($0 \leq x \leq 1$, $0 \leq y \leq 1$, and $0 \leq x+y \leq 1$). In the active layer 140, electrons injected therein through the first semiconductor layer 130, and holes injected through the second conductive semiconductor layer 150 are combined with each other to emit lights having a wavelength band determined by the intrinsic energy band of a compound semiconductor material.

The active layer 140 may include one of a single quantum well structure, a multi-quantum well structure (MQW), a quantum dot structure, or a quantum wire structure. The active layer 140 is formed by alternately providing a quantum well layer and a quantum barrier layer. The quantum well layer and the quantum barrier layer may include layers including a compound semiconductor material of a group III-V element, for example, a material having a compositional formula of $In_xAl_yGa_{1-x-y}N$ ($0 \leq x \leq 1$, $0 \leq y \leq 1$, and $0 \leq x+y \leq 1$). For example, the active layer 140 may have a stack structure of an InGaN well layer and a GaN barrier layer, or may have a stack structure of an InGaN well layer and an AlGaN barrier layer. The quantum barrier layer may include a material having a band gap higher than a band gap of the quantum well layer.

In addition, a conductive clad layer may be formed on and/or below the active layer 140, and the conductive clad layer may include an AlGaN semiconductor. The conductive clad layer may include a material having a band gap higher than that of the quantum barrier layer.

The second conductive semiconductor layer 150 may be formed on the active layer 140. The second conductive semiconductor layer 150 may include a semiconductor material having a compositional formula of $In_xAl_yGa_{1-x-y}N$ ($0 \leq x \leq 1$, $0 \leq y \leq 1$, and $0 \leq x+y \leq 1$). The second conductive semiconductor layer 150 may include a compound semiconductor of a group III-V element doped with second conductive dopants, for example, a material selected from the group consisting of GaN, AlN, AlGaN, InGaN, InN, InAlGaN, AlInN, AlGaAs, GaP, GaAs, GaAsP, and AlGaInP. When the second conductive semiconductor layer 150 is a P type semiconductor layer, the second conductive dopants may include P type dopants such as Mg and Zn. The second conductive semiconductor layer 150 may have a single layer structure or a multi-layer structure.

Meanwhile, an N type semiconductor layer may be additionally formed on the second conductive semiconductor layer 150. In addition, the first semiconductor layer 130 may be realized as a P type semiconductor layer, and the second conductive semiconductor layer 150 may be realized as an N type semiconductor. Accordingly, the light emitting structure 145 may include at least one of an N-P junction structure, a P-N junction structure, a P-N-P junction structure, and an N-P-N junction structure, but the embodiment is not limited thereto.

The dislocation 125 transferred through the light emitting structure 145 may have the form of a pit. The density of pits on the top surface of the light emitting structure 145 may be reduced by the convex portion 107. In addition, since the dislocation 125 is formed based on the vertex region 107B of the each convex portion 107, the dislocation 125 may be defined as a merge pit.

Hereinafter, a method for manufacturing the light emitting device 100 according to the embodiment will be described.

FIGS. 4 to 8 are sectional views showing the method for manufacturing the light emitting device 100 according to the embodiment.

Figure 4:
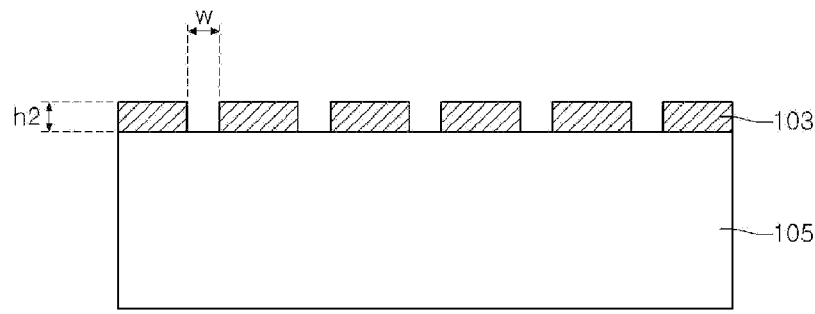
FIGS. 4 to 8 are sectional views showing a method for manufacturing the light emitting device of FIG. 1.

Referring to FIG. 4, a mask 103 is formed on the substrate 105. The mask 103 may include a plurality of holes, and the top surface 106 of the substrate 107 is exposed through the holes. The thickness h7 of the mask 103 may vary according to etching conditions, and may have a thickness of a few nm or a few μm or more.

Figure 5:
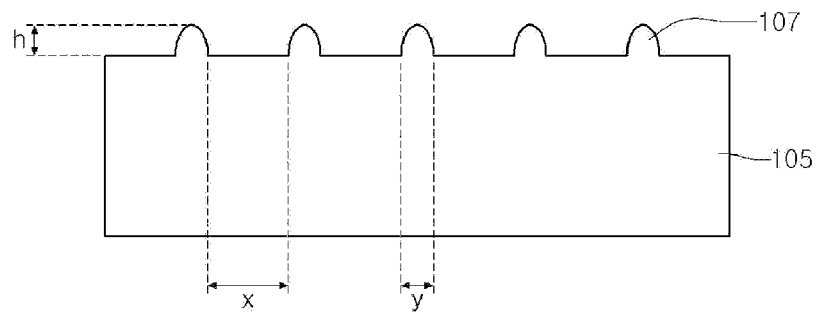

Referring to FIGS. 4 and 5, the convex portions 107 may be formed by selectively removing an upper portion of the substrate 105 along the mask 103.

The convex portions 107 may be formed through an etching process. The etching process may include at least one of a dry etching process such as an ICP (Inductively Coupled Plasma) process or a wet etching process employing etchant The height h of each convex portion 107 is in the range of about 0.5 μm to about 1.5 μm, preferably, 1.1 μm or less, and the width y of each convex portion 107 is in the range of about 0.5 μm to about 1.5 μm, preferably, about 1 μm or less. The interval x between the adjacent convex portions 107 is in the range of about 2.0 μm to about 3.0 μm, preferably, 2.5 μm or less. The lower circumferential surface of the convex portion 107 may have a curved surface without a discontinuous surface by lowering the height h of each convex portion 107 to about 1.5 μm or less.

If the convex portions 107 have the above height h, width y, and interval x, the circumferential surfaces 107A of the convex portions 107 may have a curved surface without the discontinuous surface. In other words, the convex portions 107 have continuous curved surfaces. Accordingly, the growth plane of the compound semiconductor layer exists on the flat top surface 106 of the substrate 105, and the compound semiconductor layer grown along the same growth plane can represent superior crystalline.

In more detail, if a plurality of convex portions are formed through an etching process in the case of the substrate including $Al_2O_3$, discontinuous surfaces are created on the convex portions along cleavage planes of the $Al_2O_3$ substrate. Therefore, the flat top surface 106 of the substrate 105 and the cleavage planes of the convex portions 107 are used as main growth planes of the compound semiconductor layer. If the compound semiconductor layer has a plurality of growth planes, the compound semiconductor layer is grown in various growing directions. Accordingly, a plurality of merge pits may occur according to the growth result.

The shape of each convex portion 107 may have a semi-spherical shape or a dome shape as shown in FIGS. 2 and 3, or may have a conical shape, but the embodiment is not limited thereto. The spherical surfaces may be the circumferential surfaces of the convex portions 107.

Figure 6:
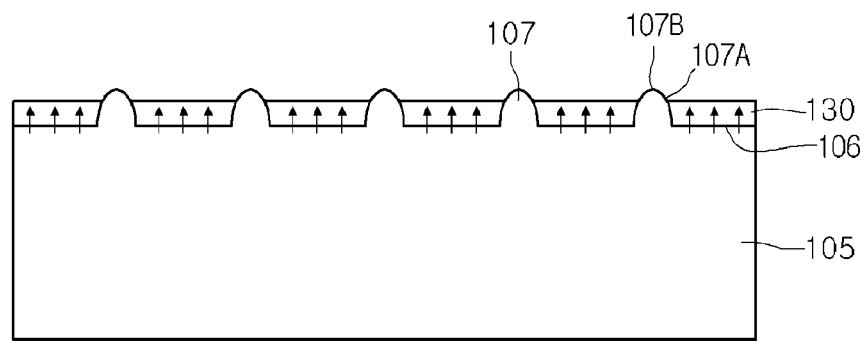
Figure 7:
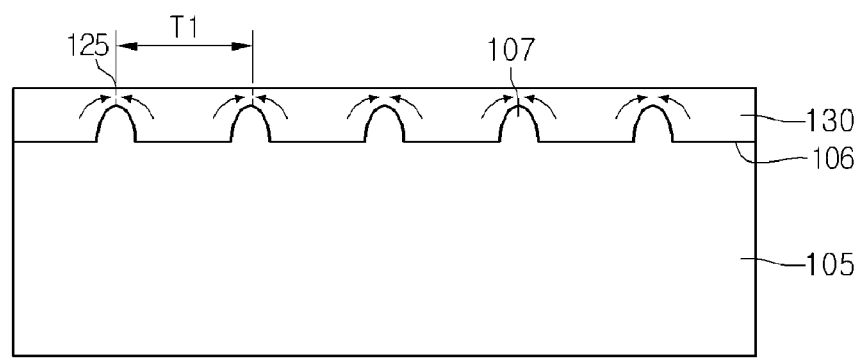

Referring to FIGS. 6 and 7, a plurality of compound semiconductor layers may be formed on the substrate 105.

The growth equipment of the compound semiconductor layer may employ at least one of an MOCVD (Metal Organic Chemical Vapor Deposition) scheme, a CVD (Chemical Vapor Deposition) scheme, a PECVD (Plasma-Enhanced Chemical Vapor Deposition) scheme, an MBE (Molecular Beam Epitaxy) scheme and an HVPE (Hydride Vapor Phase Epitaxy) scheme, but the embodiment is not limited thereto.

A group III-V compound semiconductor layer may be formed on the substrate 105. The group III-V compound semiconductor layer is the first semiconductor layer 130, and the first semiconductor layer 130 may include at least one a buffer layer, an undoped semiconductor layer, and a first conductive semiconductor layer. The first semiconductor layer 130 may be formed as a first conductive semiconductor layer. In this case, a portion of the buffer layer or the undoped semiconductor layer may be lower than a vertex of the convex portion 107. In other words, the buffer layer is not formed on the convex portion 107, but formed only on the flat top surface 106 of the substrate 105. Hereinafter, an example in which the first semiconductor layer 130 is formed on the substrate 105 will be described.

The first semiconductor layer 130 is doped with the first conductive dopants. The first conductive dopants include Si, Ge, Sn, Se, and Te. For example, the first conductive semiconductor layer 130 may be formed at a predetermined thickness by supplying silane gas including N type dopants such as $NH_3$, TMGa (or, TEGa), and Si in the case of a GaN semiconductor. In this case, the first conductive semiconductor layer 130 may be grown under a high pressure, for example, a pressure of about 4000 torr or more.

As shown in FIGS. 5 and 6, the first semiconductor layer 130 is grown from the flat top surface 106 of the substrate 105, and is not grown from the convex portions 107. The crystalline of the semiconductor layer grown from the flat top surface 106 instead of the convex portion 107 of the substrate 105 can be improved. Since the first semiconductor layer 130 is grown from the flat top surface 106 between the convex portions 107, the first semiconductor layer 130 may have discontinuous lower surface by the convex portions 107.

When the first semiconductor layer 130 is grown on the substrate 105, the first semiconductor layer 130 is grown through the top surface 106 of the substrate 105, and not grown from the circumferential surface of the convex portions 107 of the substrate 105. In addition, since the circumferential surface of the convex portion 107 of the substrate 105 is continuously curved, the group III-V compound semiconductor is not grown from the circumferential surface of the convex portions 10 at all, but grown through the top surface of the substrate 105. Accordingly, when the first semiconductor layer 130 is grown at the thickness corresponding to the thickness of the convex portions 107 of the substrate 105, the first semiconductor layer 130 may be uniformly merged on the convex portions 107. According to the above growth scheme, a semiconductor layer having another growth plane is prevented from being grown from the convex portions 107, so that the creation of the void and fine pin holes can be prevented. Since the first semiconductor layer 130 is grown in a direction perpendicular to the top surface 106 of the substrate 105 as described above, the dislocation 125 is prevented from being generated in the first semiconductor layer 120 between the convex portions 107. The first semiconductor layer 130 is merged on the upper portion of the convex portion 107 and become the dislocation 125, and the dislocation 125 may be represented as a merge pit on the surface of the first semiconductor layer 130. The dislocation density can be reduced by the convex portions 107. The interval T1 between the dislocations 125 may correspond to the interval between the convex portions 107. According to the embodiment, the densities of the dislocation 125 and the merge pit are reduced by the convex portions 107 of the substrate 105, thereby improving the internal quantum efficiency of the light emitting device.

Although the convex portions 107 are formed through an etching process for the substrate 105, the convex portions 107 may have a spherical shape after an additional material layer has been formed, but the embodiment is not limited thereto.

Figure 8:
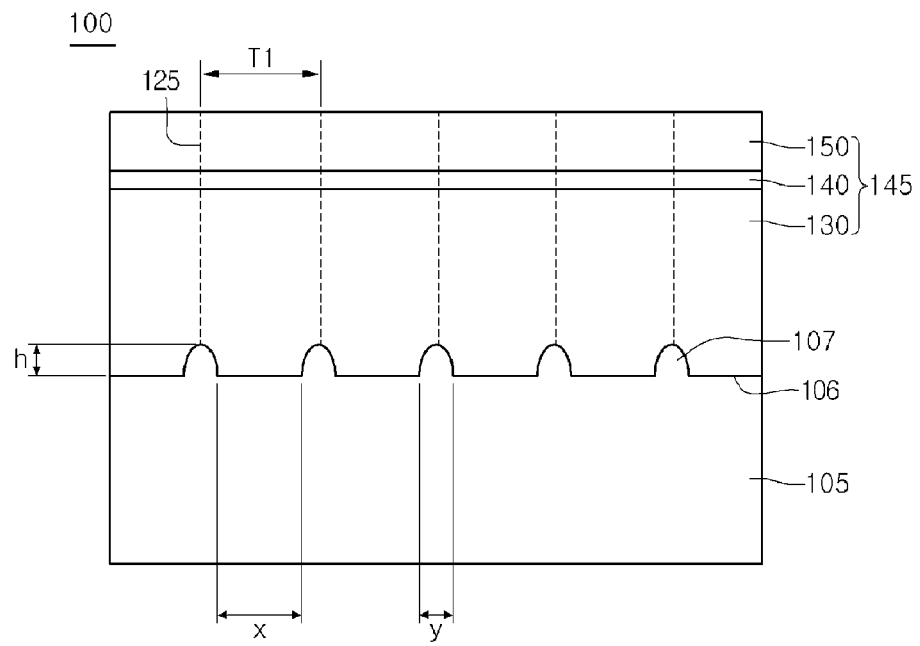

Referring to FIG. 8, after the first semiconductor layer 130 has been grown at a thickness of a few μm or more, the active layer 140 and the second conductive semiconductor layer 150 are grown on the first semiconductor layer 130. Accordingly, the light emitting structure 145 may be formed on the substrate 105.

The method for manufacturing the light emitting device according to the embodiment includes the steps of forming a plurality of convex portions having a circumferential surface formed in the form of a continuous spherical surface by etching the upper portion of the substrate 105, forming the first semiconductor layer 130 on the flat top surface 106 of the substrate 105 between the convex portions 107 at a thickness to cover the convex portions 107, forming the active layer 140 on the first semiconductor layer 130, and the second conductive semiconductor layer 150 on the active layer 140.

Figure 9:
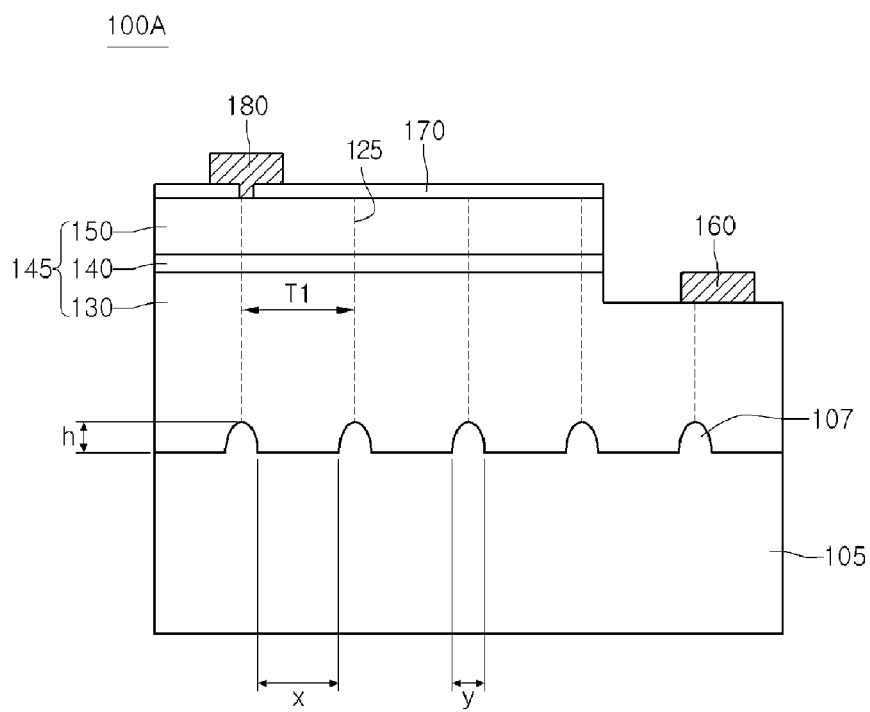
FIG. 9 is a view showing a horizontal light emitting device based on FIG. 1.

FIG. 9 is a side sectional view showing a light emitting device having a horizontal electrode structure employing the light emitting device according to the embodiment.

Referring to FIG. 9, a light emitting device 100A includes a transmissive electrode layer 170 on the light emitting structure 145. The first semiconductor layer 130 is exposed through a mesa etching process, a first electrode 160 is formed on the first semiconductor layer 130, and a second electrode 180 is formed on the transmissive electrode layer 170 and the second conductive semiconductor layer 150. The second electrode 180 may make contact with at least one of the transmissive electrode layer 170 and the second conductive semiconductor layer 150. The first and second electrodes 160 and 180 supply power to the light emitting device 100A.

The transmissive electrode layer 170 may be formed before a mesa etching process is performed or after the mesa etching process has been performed. In this case, the mesa etching process may employ a dry etching scheme such as an ICP (Inductively Coupled Plasma) scheme, but the embodiment is not limited thereto.

The transparent electrode layer 170 and the second electrode 180 may be formed on the second conductive semiconductor layer 150, but the embodiment is not limited thereto.

The transparent electrode layer 170 may include a material making an ohmic contact with the second conductive semiconductor layer 150 while representing transmittance. For example, the transparent electrode layer 170 may include at least one ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni, Ag, Ni/IrOx/Au, and Ni/IrOx/Au/ITO. The transparent electrode layer 170 may have a single layer structure or a multi-layer structure.

For example, the second electrode 180 may include at least one selected from the group consisting of Cu, Cr, Au, Al, Ag, Sn, Ni, Pt, and Pd, or the alloy thereof.

The embodiment can provide a light emitting device having a structure in which low current and ESD characteristics can be easily improved.

Figure 10:
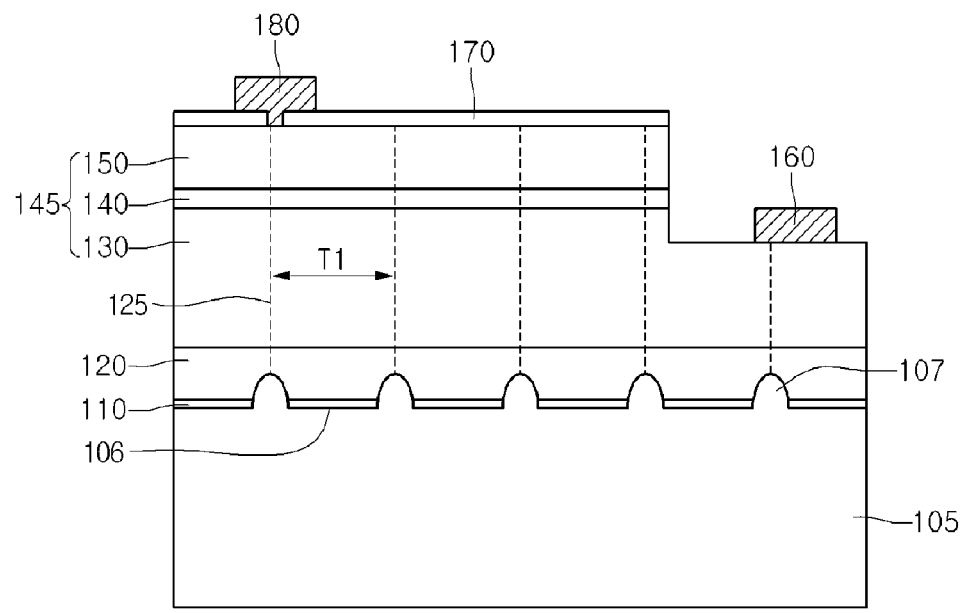
FIG. 10 is a sectional view showing another example of a light emitting device according to the embodiment.

FIG. 10 is a sectional view showing another example of a light emitting device 100B according to the embodiment.

Referring to FIG. 10, in the light emitting device 100B, a buffer layer 110 is formed on the flat top surface 106 of the substrate 105, and a second conductive layer 120 is formed on the buffer layer 110. The buffer layer 110 may include a group III-V compound semiconductor, that is, a material selected from the group consisting of GaN, AlN, AlGaN, InGaN, InN, InAlGaN, and AlInN, but the embodiment is not limited thereto. The buffer layer 110 may include a GaN-based semiconductor layer, and is formed at a thickness of several tens Å or more, thereby reducing a lattice constant difference between the substrate 105 and the GaN semiconductor layer.

The buffer layer 110 is formed between the convex portions 107, for example, formed on the flat top surface of the substrate 105. The buffer layer 110 has a thickness lower than the height of the convex portions 107, so that the buffer layer 110 is not formed on the convex portion 107. The buffer layer 110 may be formed as a discontinuous layer.

Even if the second semiconductor layer 120 is not intentionally doped, the second semiconductor layer 120 has the characteristic of an N type semiconductor, and has conductivity lower than that of the first semiconductor layer 130. The second semiconductor layer 120 is an undoped semiconductor layer and may include a material selected from the group consisting of GaN, AlN, AlGaN, InGaN, InN, InAlGaN, and AlInN. The second semiconductor layer 120 may be formed at a thickness of a few μm.

The lower portion of the second semiconductor layer 120 is formed on the buffer layer 110, and the second semiconductor layer 120 is merged over the convex portions 107. Since the lower surface of the second semiconductor layer 107 is formed on the buffer layer 110 except for the convex portions 107, the lower surface of the second semiconductor layer 120 may be formed discontinuously.

The buffer layer 110 is grown on the flat top surface 106 of the substrate 105 by the continuous curved surface of the convex portions 107. After the second semiconductor layer 120 has been grown on the buffer layer 110, the second semiconductor layer 120 may be formed at a predetermined thickness to cover the convex portions 107.

Figure 11:
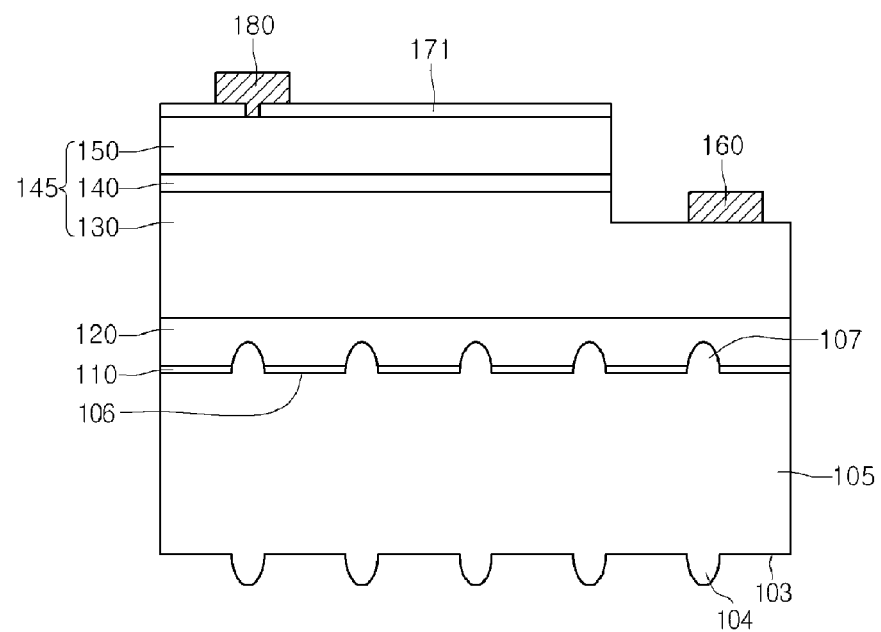
FIG. 11 is a view showing still another embodiment of the light emitting device according to the embodiment.

FIG. 11 is a sectional view showing another embodiment of a light emitting device according to the embodiment.

Referring to FIG. 11, the light emitting device includes a plurality of convex portions 104 formed on a lower surface 103 of the substrate 105. The convex portions 104 may protrude downward from the substrate 105 and have a continuous curved surface, but the embodiment is not limited thereto. The convex portions 104 may have a semispherical shape, a dome shape, or a conical shape.

Figure 12:
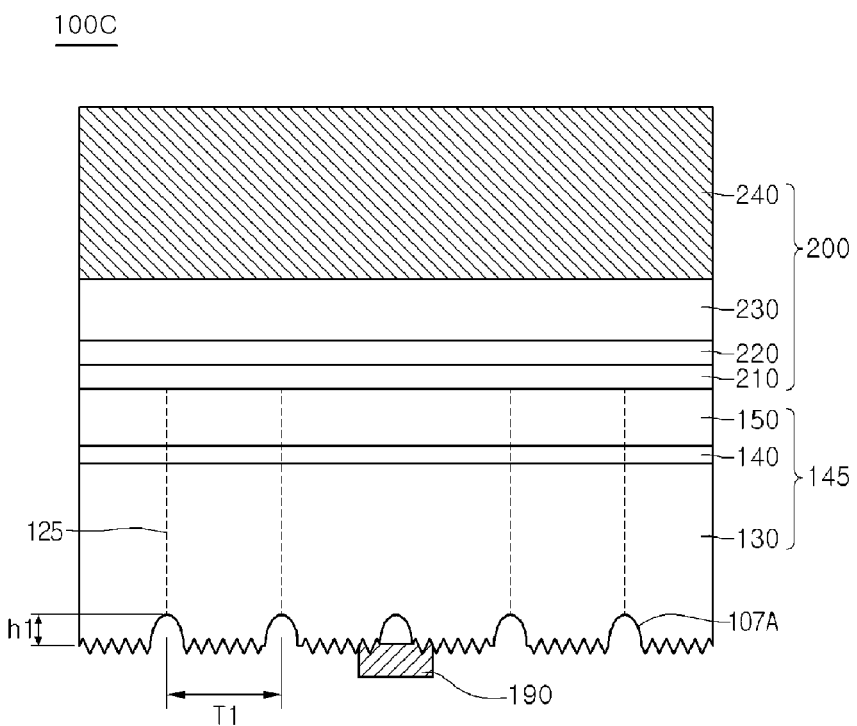
FIG. 12 is a view showing a light emitting device having a vertical electrode structure based on FIG. 1.

FIG. 12 is a side sectional view showing a light emitting device 100C having a vertical electrode structure according to the embodiment.

Referring to FIG. 12, the vertical light emitting device 100C may include a first electrode layer 200 formed on the light emitting structure 145 and a third electrode 190 formed below the light emitting structure 145. The first electrode layer 200 may include an ohmic layer 210, a reflective layer 220, a bonding layer 230, and a support member 240.

The second ohmic layer 210 may be formed on the second conductive semiconductor layer 150 to make an ohmic contact with the second conductive semiconductor layer 150. The ohmic layer 210 may include at least one of ITO, IZO, IZTO, IAZO, IGZO, IGTO, AZO, ATO, GZO, IrOx, RuOx, RuOx/ITO, Ni, Ag, Ni/IrOx/Au, and Ni/IrOx/Au/ITO, and may have a single layer structure or a multi-layer structure.

The reflective layer 220 may be formed on the ohmic layer 210. The reflective layer 220 reflects a light emitted from the light emitting structure 145 to increase an amount of lights extracted to the outside. The reflective layer 220 may include a material representing high reflectance, for example, at least one of Ag, Pd, Al, Cu, and Pt or the alloy thereof, but the embodiment is not limited thereto.

The bonding layer 230 may be formed on the reflective layer 220. The bonding layer 230 may improve interfacial adhesive strength between the support member 240 and the reflective layer 220. The bonding layer 230 may have a single layer structure or a multi-layer structure including a metallic material representing superior adhesive strength, for example, at least one of Ti, Au, Sn, Ni, Cr, Ga, In, Bi, Cu, Ag and Ta.

The support member 240 may be formed on the bonding layer 230, and may include a conductive material.

The support member 240 supports the light emitting structure 145 and can supply power to the light emitting device 100C together with the third electrode 190. The support member 240 may include at least one of Cu, Au, Ni, Mo, Cu—W, and a carrier wafer such as Si, Ge, GaAs, ZnO, SiC, or the like. The support member 240 may include an insulating material.

The support member 240 may be prepared as an additional sheet and formed through a bonding scheme, or may be formed through a deposition scheme or a plating scheme. In this case, the support member 240 may be formed through the deposition scheme or the plating scheme, and the bonding layer 230 may be not formed, but the embodiment is not limited thereto.

Figure 13:
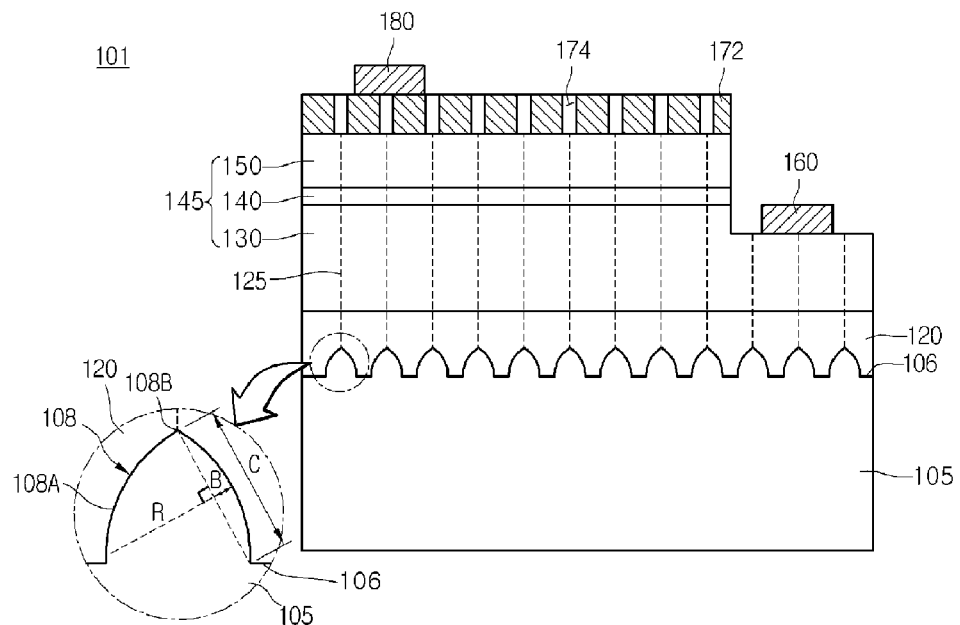
FIG. 13 is a side sectional view showing a light emitting device according to the second embodiment.

FIG. 13 is a side sectional view showing a light emitting device 101 according to a second embodiment.

Referring to FIG. 13, the light emitting device 101 may include the substrate 105, the second semiconductor layer 120 provided on the substrate 105, and the light emitting structure including the first semiconductor layer 130, the active layer 140, and the second conductive semiconductor layer 150 on the second semiconductor layer 120.

The substrate 105 is a substrate suitable for growing a single crystal structure of a nitride semiconductor, preferably, includes a material, such as sapphire, representing transmittance. In addition to the sapphire, the substrate 105 may include zinc oxide (ZnO), gallium nitride (GaN), silicon carbide (SiC), and aluminum nitride (AlN).

The second semiconductor layer 120 may be formed on the substrate 105, and may include at least one of a buffer layer and an undoped semiconductor layer. The second semiconductor layer 120 may be formed at the atmosphere of a low temperature, and may include a material selected from the group consisting of GaN, InN, AlN, AlInN, InGaN, AlGaN, and InAlGaN.

The second semiconductor layer 120 includes an undoped semiconductor layer, and the undoped semiconductor layer is formed in order to improve the crystalline of the first conductive semiconductor layer. The second semiconductor layer 120 is not doped with N type dopants and has electrical conductivity lower than that of the first conductive semiconductor layer.

In this case, before the light emitting structure 145 is provided, the substrate 105 may be subject to a chemical etching process or a scratching process using a laser beam so that convex portions 108 can be formed on the substrate 105. In addition, the convex portions 108 may be formed by performing a photolithography process after photoresist is coated and a patterning process is performed. In this case, the etching scheme may include one of a dry etching scheme and a wet etching scheme, but the embodiment is not limited thereto.

A circumferential surface 108A of the convex portions 108 is rounded to form a curved surface, and a vertex region 108B may be formed at the uppermost portion of the convex portions 108. In addition, the convex portion 108 has a circular lower portion or a polygonal lower portion, but the embodiment is not limited thereto.

The convex portions 108 can increase the light emitting efficiency of the light emitted from the light emitting structure 145 by scattering the light emitted from the light emitting structure 145. Therefore, the external quantum efficiency of the light emitting device 100 can be increased.

The circumferential surface 108 of the convex portion 108 is rounded, so that the creation of the dislocation 125 by the circumferential surface 108A of the convex portion 108 is prevented. Accordingly, the density of the dislocation 125 generated from the vertex region 108B can be reduced. Accordingly, the crystal defects can be reduced in the second semiconductor layer 120.

In addition, the second semiconductor layer 120 and the light emitting structure 145 are grown on the substrate 105. The second semiconductor layer 120 is grown from the flat top surface 106 of the substrate 105 and has a thickness higher than the thickness of the convex portions 108.

The dislocation 125 is formed in the second semiconductor layer 120 corresponding to the vertex region 108B of the convex portion 108. The dislocation 125 is linearly formed through the merge of the second semiconductor layer 120, so that the dislocation 125 may be used as one leakage path.

In the structure of the convex portion 108, on the assumption that C (chord) represents a distance between the vertex of the convex portion 108 and a point where the flat top surface 106 of the substrate 105 starts, and R (radius) represents the radius of a circle according to a rounding radius, the height difference B (rise) between the circumferential surface 108A and the plane defined by the chord C can be calculated.

The height difference B can be calculated through following Equation 1.

$$\text{Rise}(B) = R(\text{Radius}) \times \left(1 - \cos\left[\frac{\left(\frac{C(\text{Chord})}{2}\right)}{R(\text{Radius})}\right]\right) \quad \text{Equation 1}$$

In detail, Equation 1 represents the height difference B for a rounded edge portion determined based on the radius R and the distance C. Due to the height difference B, the circumferential surface 108A of the convex portion 108 can be prepared in the form of a dome having a continuous arc shape. The vertex region 108B of the convex portion 108 may be a portion of a continuous curved surface. The convex portion 108 has a continuous curved surface, so that the semiconductor layer is grown from the flat top surface 106 of the substrate 105 in an initial stage, and the semiconductor layer is merged at the vertex region of the convex portion 108. In this case, the dislocation 125 may be generated at the vertex region 108B of the convex portion 108. The dislocation 125 does not exist in a region except for the vertex region 108B due to the structure of the convex portion 108, so that dislocation density can be reduced. The height, the interval, and the width of the convex portion 108 may be equal to those of the convex portion according to the embodiment, but the embodiment is not limited thereto The light emitting structure 145 may include the first semiconductor layer 130, the second conductive semiconductor layer 150, and the active layer 140 interposed between the first and second conductive semiconductor layers 130 and 150.

The first semiconductor layer 130 is provided on the second semiconductor 120, and may be formed by supplying silane ($SiH_4$) gas including first conductive dopants such as $NH_3$, TMGa, or Si. The first semiconductor layer 130 may have a multi-layer structure, and may further include a clad layer.

The first semiconductor layer 130 includes an N type semiconductor layer to supply electrons to the active layer 140. The first semiconductor layer 130 may include only the first conductive semiconductor layer. The first conductive semiconductor layer, for example, the N type semiconductor layer may include a semiconductor material having a compositional formula of $In_xAl_yGa_{1-x-y}N$ ($0 \leq x \leq 1$, $0 \leq y \leq 1$, and $0 \leq x+y \leq 1$), for example, a material selected from the group consisting of GaN, AlN, AlGaN, InGaN, InN, InAlGaN, and AlInN. The first conductive semiconductor layer may be doped with N type dopants such as Si, Ge, and Sn.

The active layer 140 may include a semiconductor material having a compositional formula of $In_xAl_yGa_{1-x-y}N$ ($0 \leq x \leq 1$, $0 \leq y \leq 1$, and $0 \leq x+y \leq 1$), and may have a single quantum well structure or a multi-quantum well (MQW) structure. The well layer may include a material having band gap lower than that of the barrier layer. The well layer may include a quantum wire structure or a quantum dot structure. The active layer 140 recombines electrons with holes to generate a light having a wavelength band from a ultra-violet ray band to a visible ray band.

The second conductive semiconductor layer 150 supplies holes to the active layer 140, and may be realized as, for example, a P type semiconductor layer. The P type semiconductor layer may include a semiconductor material having a chemical formula of $In_xAl_yGa_{1-x-y}N$ ($0 \leq x \leq 1$, $0 \leq y \leq 1$, and $0 \leq x+y \leq 1$), for example, a material selected from the group consisting of GaN, MN, AlGaN, InGaN, InN, InAlGaN, and AlInN. The P type semiconductor layer may be doped with P type dopants such as Mg, Zn, Ca, Sr, and Ba.

In addition, the third conductive semiconductor layer (not shown) including an N type semiconductor layer or a P type semiconductor layer may be formed on the second conductive semiconductor layer 150. Accordingly, the light emitting structure 145 may have at least one of an N-P junction structure, a P-N junction structure, an N-P-N junction structure, and a P-N-P junction structure.

The dopants doped in the first semiconductor layer 130 and the second conductive semiconductor layer 150 may have uniform doping concentration or irregular doping concentration. In other words, the structure of a plurality of semiconductor layers may have various shapes, but the embodiment is not limited thereto.

Differently from the above structure, the first semiconductor layer 130 may include a P type semiconductor layer, and the second conductive semiconductor layer 150 may include an N type semiconductor layer. In other words, the positions of the first semiconductor layer 130 and the second conductive semiconductor layer 150 may be changed with each other about the active layer 140. Hereinafter, the case in which the first semiconductor layer 130 including an N type semiconductor layer is formed on the substrate 105 will be described.

The dislocation region 125 is transferred through the above layers 130, 140, and 150 of the light emitting structure 130, 140, and 150 of the light emitting structure 145 and may be exposed to the top surface of the light emitting structure 145. The dislocation region 125 serves as a pit, and is used as a current leakage path.

Portions of the active layer 140, the second conductive semiconductor layer 150, and the first semiconductor layer 130 are mesa-etched to expose a portion of the first semiconductor layer 130. The first electrode 160 including titan (Ti) may be formed at one side of the top surface of the first semiconductor layer 130.

A transmissive electrode layer 172 may be formed on the second conductive semiconductor layer 150, and a second electrode 180 including nickel (Ni) may be formed at one side of an outer portion of the transmissive electrode layer 172.

The transmissive electrode layer 172 may include at least one selected from the group consisting of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au, and Ni/IrOx/Au/ITO. The transmissive electrode layer 172 is formed at the entire portion or a portion of one outer portion of the second conductive semiconductor layer 150, so that current crowding can be prevented.

The transmissive electrode layer 172 includes a hole 174 corresponding to the vertex region 108B of each convex portion 108. The dislocation 125 is formed in a vertical direction by the vertex region 108B of the convex portion 108, and provided corresponding to the lower portion of the hole 174. When the current supplied from the second electrode 180 is diffused to the transmissive electrode layer 172 and supplied to the second conductive semiconductor layer 150, the current can be prevented from being concentrated on the leakage path. The width of the hole 174 may be narrower than the width of the convex portion 108, and may be greater than the width of the vertex region 108B.

The light emitting device according to the embodiment represents a light emitting device having a horizontal electrode structure. The light emitting device may be formed as a light emitting device having a vertical electrode structure as shown in FIG. 12, but the embodiment is not limited thereto.

Figure 14:
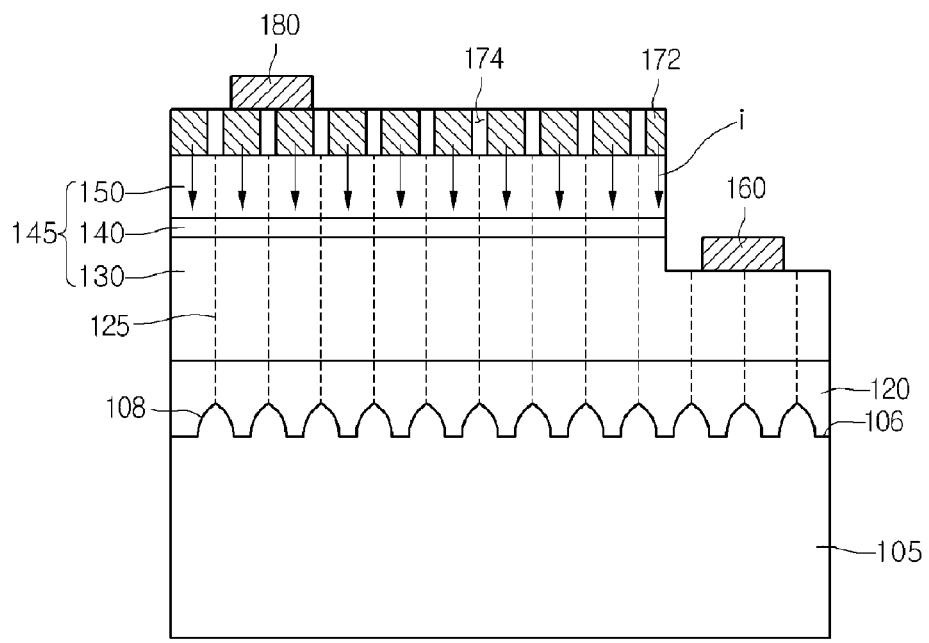
FIG. 14 is a sectional view showing current flow in the light emitting device of FIG. 13.
Figure 15:
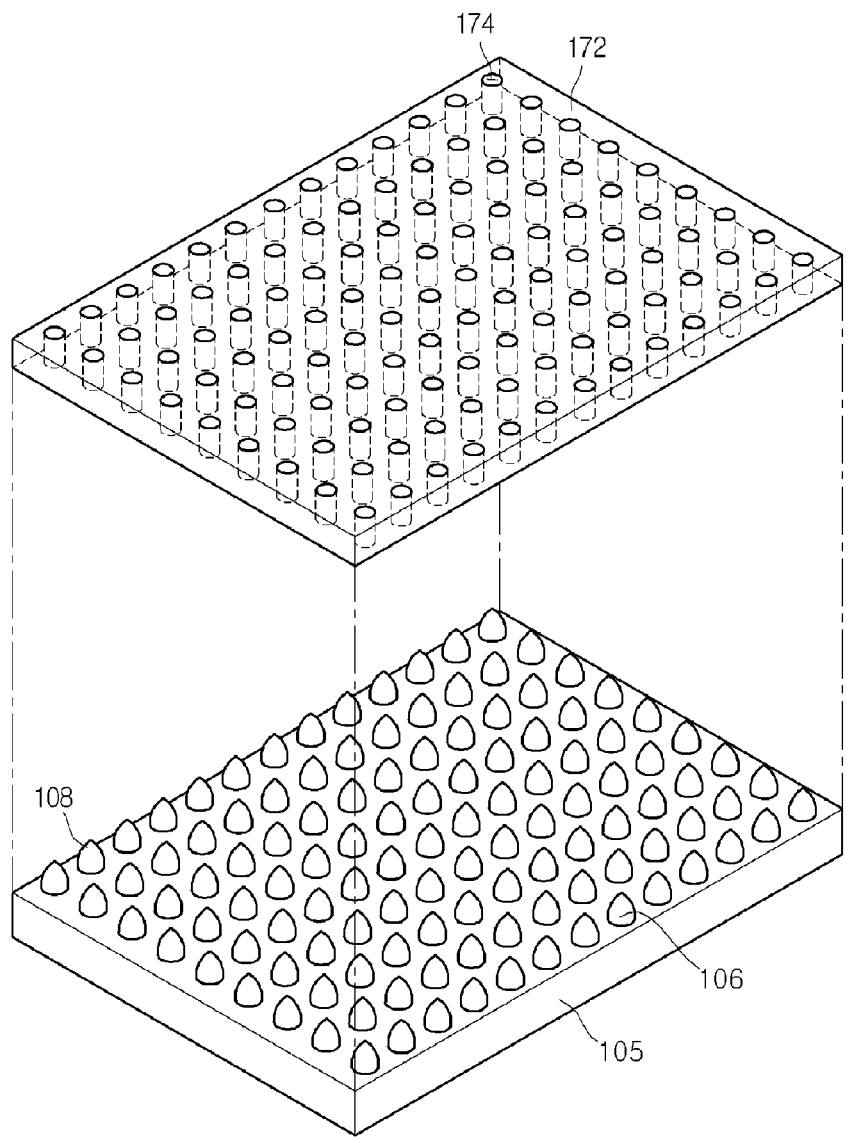
FIG. 15 is an exploded perspective view showing an electrode layer and a protrusion portion of a substrate in a light emitting device of FIG. 13.

FIG. 14 is a sectional view showing the operation of the light emitting device of FIG. 13 in terms of current movement, and FIG. 15 is an exploded perspective view showing the substrate and the transmissive electrode layer of FIG. 14.

Referring to FIGS. 14 and 15, in the light emitting device, a current i supplied from the second electrode 180 is diffused through a plurality of holes 147 formed in the transmissive electrode layer 172 and supplied to the second conductive semiconductor layer 150.

The vertex of the convex portion 108 formed on the substrate 105 can create a leakage path to the second conductive semiconductor layer 150 which is the uppermost layer of the light emitting structure 145.

In this case, as the vertex of the convex portion 108 is provided corresponding to the hole 174, the current i diffused by the transmissive electrode layer 172 does not leak through the dislocation. In addition, since the second conductive semiconductor layer 130 represents low diffusive mobility of electrons, even if the current i is supplied, current leakage may not occur through the dislocation.

In this case, FIG. 15 shows the substrate 105 and the transmissive electrode layer 172, and the light emitting structure is provided between the substrate 105 and the transmissive electrode layer 172.

As shown in FIG. 15, the substrate 105 is formed thereon with the convex portions 108 corresponding to the holes 174 formed in the transmissive electrode layer 172. In this case, as shown in FIG. 13, the holes 174 are provided corresponding to the vertexes of the convex portions 108, so that the current supplied from the second electrode 180 is prevented from flowing to the dislocation through the current leakage path created when the semiconductor layer is grown. In this case, the convex portions 108 have a circular lower portion. Although FIG. 15 shows that the convex portions 108 have the circular lower portion, the embodiment is not limited thereto. Although the holes 174 have a semispherical shape, the embodiment is not limited thereto.

The transmissive electrode layer 172 may be interposed between the first electrode 160 and the first semiconductor layer 130, may have holes 174, or may be formed in the lattice pattern. In addition, the transmissive electrode layer 172 may include connection electrode lines connecting a plurality of electrode lines with a plurality of electrode lines, but the embodiment is not limited thereto.

In this case, the electrode lines have a stripe structure. The connection electrode lines can electrically connect the electrode lines with each other, but the embodiment is not limited thereto. In addition, when the transmissive electrode layer 172 has only a stripe structure, the transmissive electrode layer 172 may be provided only at the lower portion of the second electrode 140.

Figure 16:
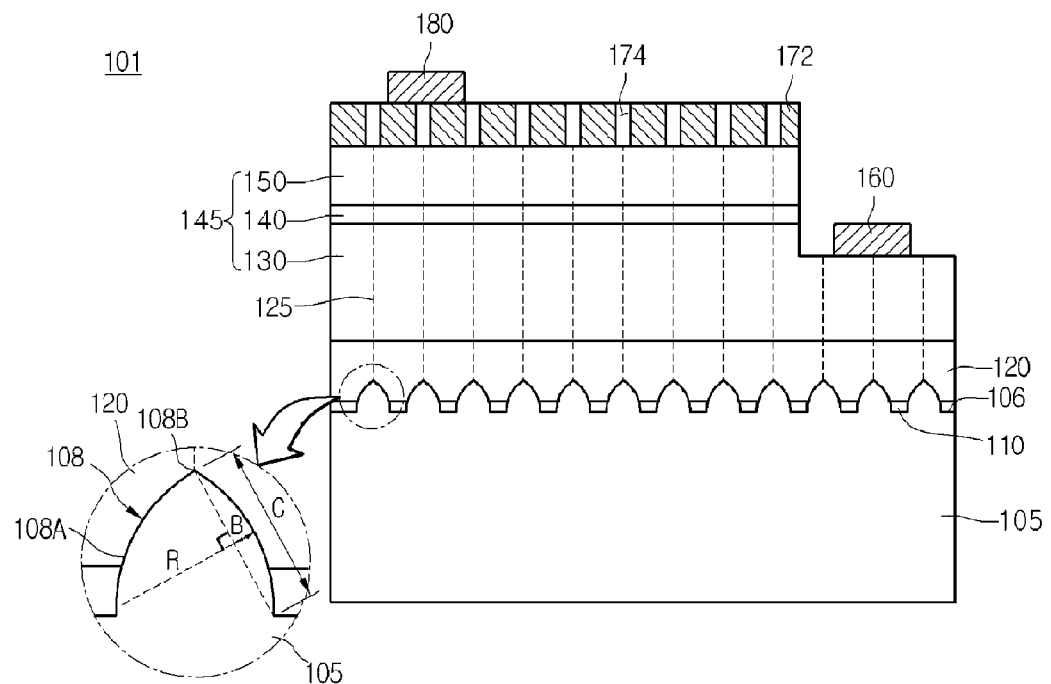
FIG. 16 is a sectional view showing another example of a light emitting device of FIG. 13.

FIG. 16 is a sectional view showing the light emitting device 101 of FIG. 13.

Referring to FIG. 16, the light emitting device 101 includes the buffer layer 110 interposed between the substrate 105 and the second semiconductor layer 120, and the buffer layer 110 is formed on the flat top surface 106 of the substrate 105. The buffer layer 110 has a discontinuous structure due to the convex portions 108.

Figure 17:
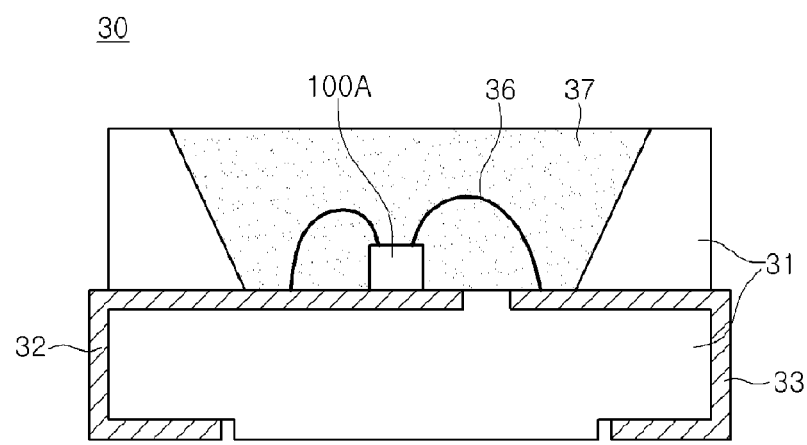
FIG. 17 is a view showing a light emitting device package having a light emitting device of FIG. 9.

FIG. 17 is a side sectional view showing a light emitting device package 30 including a light emitting device according to the embodiment.

Referring to FIG. 17, the light emitting device package 30 according to the embodiment includes a body 31, first and second lead electrodes 32 and 33 installed in the body 31, a light emitting device 100A according to the embodiment, which is installed in the body 31 and electrically connected to the first and second lead electrodes 32 and 33, and a molding member 37 that surrounds the light emitting device 100A.

The body 31 may include at least one of silicon material, synthetic material, metallic material, sapphire ($Al_2O_3$), and a PCB (Printed Circuit Board). The body 31 may include at least one selected from the group consisting of resin material such as polyphthalamide (PPA), silicon (Si), aluminum (Al), aluminum nitride (AlN), photo sensitive glass (PSG), polyamide9T (PA9T), syndiotactic polystyrene (SPS), metallic material, sapphire ($Al_2O_3$), beryllium oxide (BeO), PCB (Printed Circuit Board), and ceramic. The body 31 may be formed by performing an injection molding process or an etching process, but the embodiment is not limited thereto. Inclined surfaces may be formed around the light emitting device 100A.

The first and second lead electrodes 32 and 33 are electrically isolated from each other and used to supply power to the light emitting device 100A. The first and second lead electrodes 32 and 33 may include a metallic material. The first and second lead electrodes 32 and 33 may include at least one selected from the group consisting of Ti, Cu, Ni, Au, Cr, Ta, Pt, Sn, Ag, P, Al, In, Pd, Co, Si, Ge, Hf, Ru, and Fe, or the alloy thereof.

In addition, the first and second lead electrodes 32 and 33 can increase light efficiency by reflecting a light generated from the light emitting device 100A, and can discharge heat from the light emitting device 100A to the outside. The light generated from the light emitting device 100A can be selectively formed in the wavelength bands from a visible ray band to an ultra-ray band. For example, the light emitting device 100A may emit a light in the wavelength band of blue, green, red, and ultraviolet.

One ends of the first and second lead electrodes 32 and 33 are provided on the body 31, and opposite ends of the first and second lead electrodes 32 and 33 are provided on the lower surface of the body 21 along the outside of the body 31. However, the embodiment is not limited thereto.

The light emitting device 100A may be mounted on the body 341, or may be mounted on the first lead electrode 32 or the second lead electrode 33.

The light emitting device 100A can be electrically connected to the first and second electrode layers 32 and 33 through a wire scheme, but the embodiment is not limited thereto. For example, the light emitting device 100A may be electrically connected to the first and second lead electrodes 32 and 33 through a flip chip scheme or a die bonding scheme. The light emitting device 100A may have a horizontal electrode structure or a vertical electrode structure, but the embodiment is not limited thereto.

The molding member 37 may include silicon material or resin material having transmittance, and may protect the light emitting device 100A while surrounding the light emitting device 100A. In addition, the molding member 32 includes a phosphor material to change the wavelength of a light emitted from the light emitting device 100A. The phosphor material may include one of phosphor materials emitting blue, bluish green, green, yellowish green, yellow, yellowish red, orange, and red lights.

If the light emitting device 100A includes a green LED, a magenta phosphor material or the mixture of blue and red phosphor materials may be used. If the light emitting device 100A includes a red LED, a cyan phosphor material, or the mixture of the blue and green phosphor materials may be used.

The above phosphor materials may include a material selected from the group consisting of YAG, TAG, sulfide, silicate, aluminate, nitride, carbide, nitridosilicate, borate, fluoride, and phosphate based materials.

Although a top view type light emitting device package is shown and described according to the embodiment, a side view type light emitting device package can be realized to improve the thermal characteristic, the conductivity, and the reflective characteristic. After the top view type or the side view type light emitting device has been packaged by using a resin layer as described above, a lens may be formed on the resin layer, or may be attached to the resin layer, but the embodiment is not limited thereto.

Figure 18:
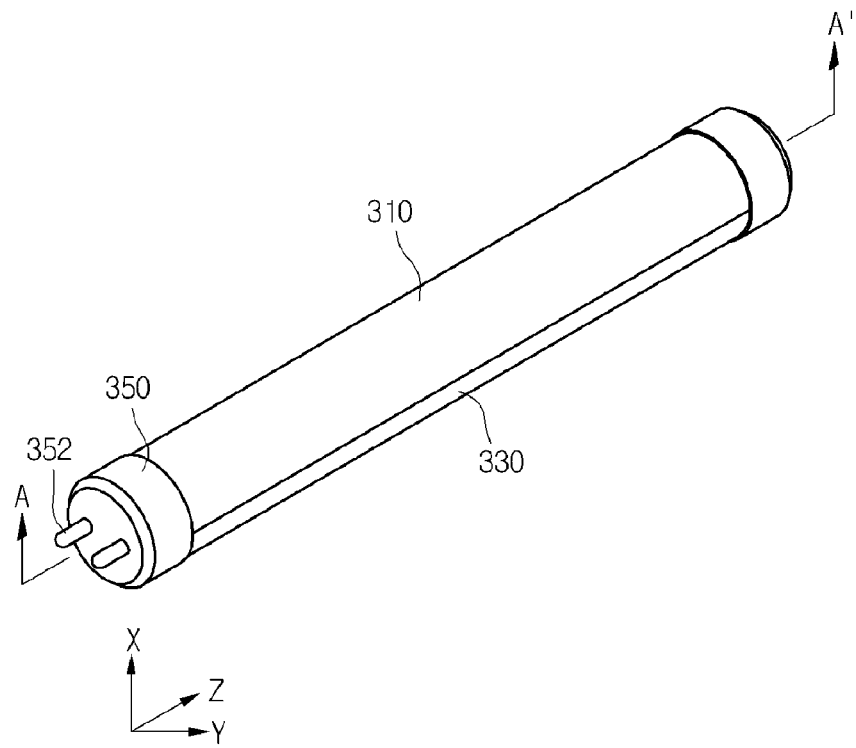
FIG. 18 is a view showing a lighting device having a light emitting device according to the embodiment.
Figure 19:
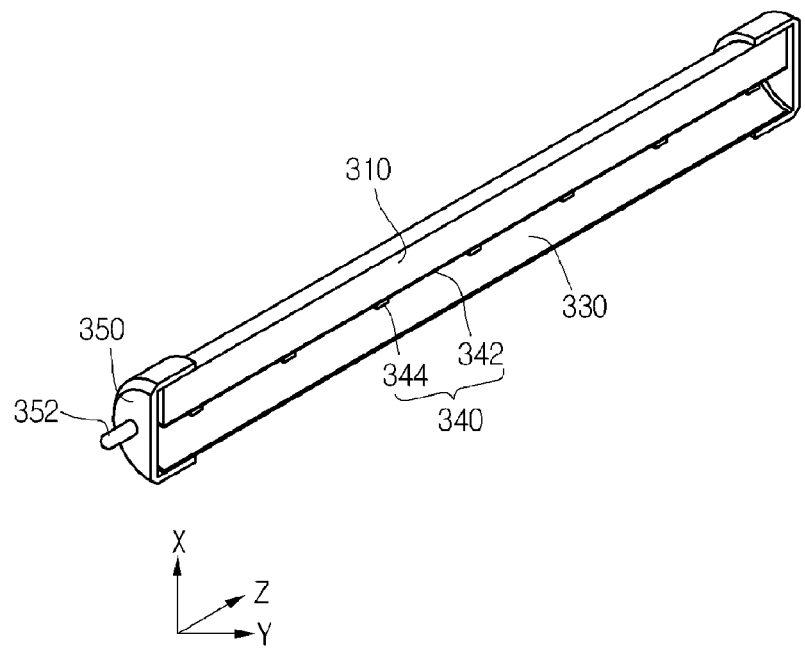
FIG. 19 is a sectional view taken line A-A' of the lighting device of FIG. 18.

FIG. 18 is a perspective view showing a lighting device including a light device package according to the embodiment, and FIG. 19 is a sectional view taken along line A-A' of the lighting device of FIG. 18.

Hereinafter, the details of the shape of the lighting device 300 will be described in more in terms of a length direction Z, a horizontal direction Y perpendicular to the length direction Z, and a height direction X perpendicular to the length and horizontal directions Z and Y of the lighting device 300. In other words, FIG. 19 is a sectional view of the lighting device 300 of FIG. 18 taken along the length and height directions Z and X and viewed in the horizontal direction Y.

Referring to FIGS. 18 and 19, the lighting device 300 includes a body 310, a cover coupled with the body 310, and finish caps 350 positioned at both ends of the body 310.

A light emitting device module 340 is coupled with a lower surface of the body 310, and the body 310 may include metallic material representing superior conductivity and heat radiation effects so that heat emitted from the light emitting device module 340 can be dissipated to the outside through the top surface of the body 310.

The light emitting device module 340 includes a light emitting device package 344 including a board 342 and a light emitting device (not shown). A plurality of light emitting device packages 344 may be mounted on the board 342 in a plurality of rows while forming an array. The light emitting device packages 344 may be mounted at the same interval or various intervals according to necessities, so that the brightness can be adjusted. The board 343 may include an MCPCB (Metal Core PCB) or a PCB including an FR4 material.

A cover 330 has a circular shape to surround the lower surface of the body 310, but the embodiment is not limited thereto.

The cover 330 protects the light emitting module 340 provided therein from external foreign matters. In addition, the cover 330 may include diffusion particles so that a user can be prevented from being dazzled by the light emitted from the light emitting device package 344, and the light can be uniformly emitted to the outside. In addition, the cover 330 may have a prism pattern on one of inner and outer surfaces. In addition, a phosphor material may be coated on at least one of the inner and outer surfaces of the cover 330.

Meanwhile, since the light emitted from the light emitting device package 344 can be discharged to the outside through the cover 330, the cover 330 must have superior light transmittance. In addition, the cover 330 must have a superior heat resistant property so that the cover 330 can endure the heat emitted from the light emitting device package 344. The cover 330 may preferably include PET (polyethylen terephthalate), PC (polycarbonate), or PMMA (polymethyl methacrylate).

The caps 350 are positioned at both ends of the body 310 to seal a power supply (not shown). In addition, power pins 352 are formed on the caps 350, so that the lighting device 300 according to the embodiment may be directly applied to terminals, from which a conventional fluorescence lamp is removed, without an additional device.

<Lighting System>

The light emitting devices and the light emitting device packages according to the embodiments may be applied to a light unit. The light unit may have an array structure including a plurality of light emitting devices or a plurality of light emitting device packages. The lighting system may include a display apparatus shown in FIGS. 20 and 21, a light unit shown in FIG. 22, in addition to a lighting lamp, a signal light, a vehicle headlight, an electronic display, etc.

Figure 20:
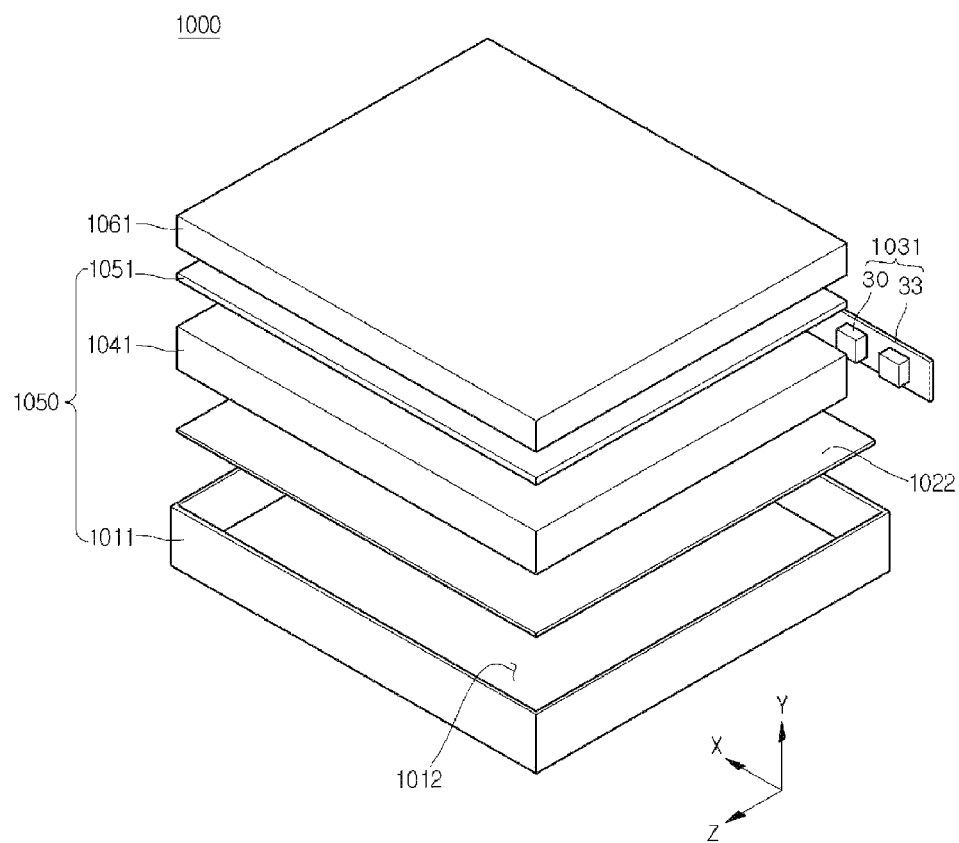
FIG. 20 is a disassembled perspective view of a display apparatus provided with the light emitting device or the light emitting device package.

FIG. 20 is a disassembled perspective view of a display apparatus according to an embodiment.

Referring to FIG. 20, the display apparatus 1000 according to the embodiment may include a light guide panel 1041, a light emitting module 1031 supplying light to the light guide panel 1041, a reflective member 1022 under the light guide panel 1041, an optical sheet 1051 on the light guide panel 1041, a display panel 1061 on the optical sheet 1051, and a bottom cover 1011 receiving the light guide panel 1041, the light emitting module 1031, and the reflective member 1022, but the present disclosure is not limited thereto.

The bottom cover 1011, the reflective sheet 1022, the light guide panel 1041, and the optical sheet may be defined as a light unit 1041.

The light guide panel 1041 functions to transform linear light to planar light by diffusing the linear light. The light guide panel 1041 may be made of a transparent material, and may include one of acryl-series resin such as polymethyl methacrylate (PMMA), polyethylene terephthalate (PET), poly carbonate (PC), COC, and polyethylene naphthalate resin.

The light emitting module 1031 provides light to at least a side surface of the light guide panel 1041, and finally acts as a light source of a display apparatus.

The light emitting module 1031 may include at least one light emitting module, and provide light directly or indirectly from one side surface of the light guide panel 1041. The light emitting module 1031 may include a board 1033, and a light emitting device package 30 according to embodiments disclosed above, and the light emitting device packages 30 may be arranged apart by a predetermined interval from each other on the board 1033.

The board 1033 may be a printed circuit board (PCB) including a circuit pattern (not shown). The board 1033 may include a metal core PCB (MCPCB), a flexible PCB (FPCB), etc. as well as the general PCB, but the present disclosure is not limited thereto. In the case where the light emitting device package 30 is mounted on a side surface or a heat releasing plate, the board 1033 may be removed. Herein, some of the heat releasing plate may contact an upper surface of the bottom cover 1011.

The plurality of light emitting device packages 30 may be mounted on the board 1033 such that light emitting surfaces of the plurality of light emitting device packages 30 are spaced apart by a predetermined distance from the light guide panel 1041, but the present disclosure is not limited thereto. The light emitting device package 30 may supply light to a light incident part that is one side surface of the light guide panel 1041, directly or indirectly, but the present disclosure is not limited thereto.

The reflective member 1022 may be provided under the light guide panel 1041. The reflective member 1022 reflects light incident from a lower surface of the light guide panel 1041 to allow the reflected light to be directed toward an upper direction, thereby capable of enhancing brightness of the light unit 1050. The reflective member 1022 may be formed of, for example, PET, PC, PVC resin, or the like, but the present disclosure is not limited thereto.

The bottom cover 1011 may receive the light guide panel 1041, the light emitting module 1031, the reflective member 1022, and the like. For this purpose, the bottom cover 1011 may have a receiving part 1012 formed in a box shape a top surface of which is opened, but the present disclosure is not limited thereto. The bottom cover 1011 may be coupled to a top cover, but the present disclosure is not limited thereto.

The bottom cover 1011 may be formed of a metal material or resin material, and may be manufactured by using a process such as a press molding or an injection molding. Also, the bottom cover 1011 may include metallic or nonmetallic material having a high thermal conductivity, but the present disclosure is not limited thereto.

The display panel 1061 is, for example, an LCD panel, and includes first and second transparent substrates facing each other, and a liquid crystal layer interposed between the first and second substrates. A polarizing plate may be attached on at least one surface of the display panel 1061, but the present disclosure is not limited thereto. The display panel 1061 displays information by using light passing through the optical sheet 1051. The display apparatus 1000 may be applied to a variety of mobile terminals, monitors for notebook computers, monitors for lap-top computers, televisions, etc.

The optical sheet 1051 is disposed between the display panel 1061 and the light guide panel 1041, and includes at least one transparent sheet. The optical sheet 1051 may include, for example, at least one of a diffusion sheet, a horizontal and/or vertical prism sheet, and a brightness reinforcing sheet. The diffusion sheet diffuses incident light, the horizontal and/or vertical prism sheet focuses incident light on a display region, and the brightness reinforcing sheet enhances the brightness by reusing lost light. Also, a protective sheet may be disposed on the display panel 1061, but the present disclosure is not limited thereto. Herein, the display apparatus 1000 may include the light guide panel 1041, and the optical sheet 1051 as optical members positioned on a light path of the light emitting module 1031, but the present disclosure is not limited thereto.

Figure 21:
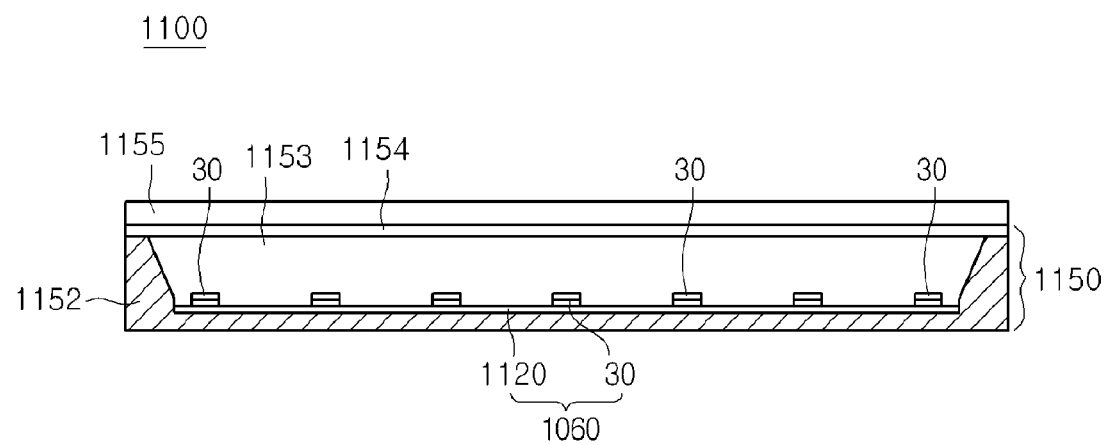
FIG. 21 is a schematic sectional view illustrating another example of a display apparatus provided with the light emitting device or the light emitting device package.

FIG. 21 is a cross-sectional view of a display apparatus according to an embodiment.

Referring to FIG. 21, the display apparatus 1100 includes a bottom cover 1152, a board 1120 on which the light emitting device packages 30 disclosed above are arrayed, an optical member 1154, and a display panel 1155.

The board 1120 and the light emitting device package 30 may be defined as a light emitting module 1060. The bottom cover 1152, the at least one light emitting module 1060, and the optical member 154 may be defined as a light unit.

The bottom cover 1152 may be provided with a receiving part, but the present disclosure is not limited thereto.

Herein, the optical member 1154 may include at least one of a lens, a light guide panel, a diffusion sheet, a horizontal and vertical prism sheet, and a brightness reinforcing sheet. The light guide panel may be formed of polycarbonate (PC) or poly methyl methacrylate (PMMA), and may be removed. The diffusion sheet diffuses incident light, the horizontal and vertical prism sheet focuses incident light on a display region, and the brightness reinforcing sheet enhances the brightness by reusing lost light.

The optical member 1154 is disposed on the light emitting module 1060. The optical member 154 transforms light emitted from the light emitting module 1060 to planar light, and performs diffusion, light focusing, and the like.

Figure 22:
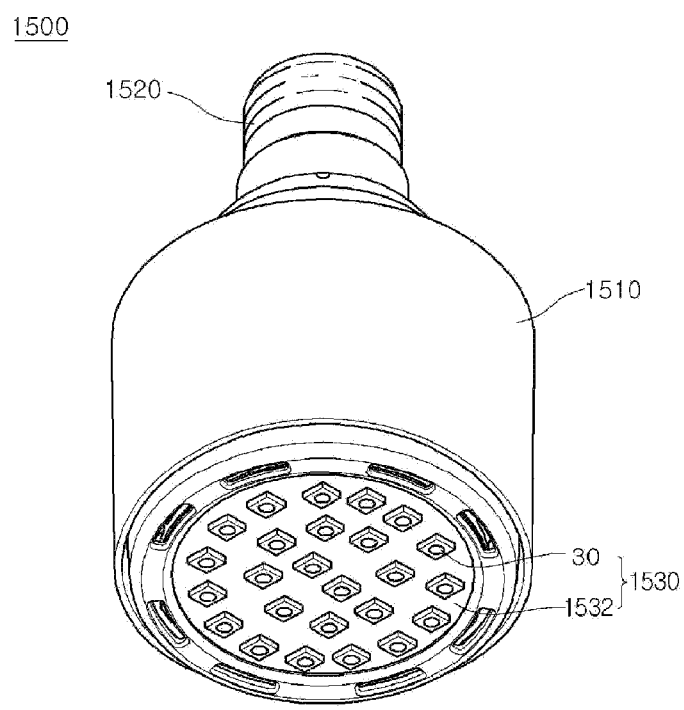
FIG. 22 is a perspective view of a lighting unit provided with the light emitting device or the light emitting device package.

FIG. 22 is a perspective view of a lighting unit according to an embodiment.

Referring to FIG. 22, the lighting unit 1500 may include a case 1510, a light emitting module 1530 equipped in the case 1510, and a connection terminal 1520 equipped in the case 1510 and supplied with an electric power from an external power supply.

The case 1510 may be preferably formed of a material having good heat shielding characteristics, for example, a metal material or a resin material.

The light emitting module 1530 may include a board 1532, and at least one light emitting device package 30 according to the embodiments mounted on the board 1532. The light emitting device package 30 may include a plurality of light emitting device packages which are arrayed apart by a predetermined distance from one another in a matrix configuration.

The board 1532 may be an insulator substrate on which a circuit pattern is printed, and may include, for example, a printed circuit board (PCB), a metal core PCB, a flexible PCB, a ceramic PCB, an FR-4 substrate, etc.

Also, the board 1532 may be formed of a material to efficiently reflect light, and a surface thereof may be formed in a color capable of efficiently reflecting light, for example, white color, or silver color.

The at least one light emitting device packages 30 may be mounted on the board 1532. Each of the light emitting device packages 30 may include at least one light emitting diode (LED) chip. The LED chip may include a color LED emitting red, green, blue or white light, and a UV LED emitting ultraviolet (UV).

The light emitting module 1530 may have a combination of various light emitting device packages so as to obtain desired color and luminance. For example, the light emitting module 1530 may have a combination of a white LED, a red LED, and a green LED so as to obtain a high color rendering index (CRI).

The connection terminal 1520 may be electrically connected to the light emitting module 1530 to supply power. The connection terminal 1520 may be screwed and coupled to an external power in a socket type, but the present disclosure is not limited thereto. For example, the connection terminal 1520 may be made in a pin type and inserted into an external power, or may be connected to the external power through a power line.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a substrate;
    a plurality of convex portions protruding from a flat top surface of the substrate;
    a first semiconductor layer on the substrate;
    an active layer on the first semiconductor layer;
    a second conductive semiconductor layer on the active layer; and
    a transmissive electrode layer having a plurality of holes on the second conductive semiconductor layer, wherein each hole has a width narrower than a width of each convex portion,
    wherein a circumferential surface of each convex portion includes a continuous rounded surface, and a height of the convex portion is about 1.5 μm or less,
    wherein the first semiconductor layer includes a buffer layer, and the buffer layer has a thickness smaller than a height of the convex portion,
    wherein the substrate has the flat top surface between the plurality of convex portions protruding more than the flat top surface, and
    wherein the first semiconductor layer includes a plurality of dislocations having an interval greater than an interval between the convex portions.

2. The light emitting device of claim 1, wherein the convex portion includes a material a same as a material of the substrate.

3. The light emitting device of claim 2, wherein the substrate includes a sapphire material.

4. The light emitting device of claim 1, wherein the height of the convex portion is in a range of about 0.5 μm to about 1.5 μm.

5. The light emitting device of claim 4, wherein a width of the convex portion is in a range of about 0.5 μm to about 1.5 μm.

6. The light emitting device of claim 5, wherein an interval between the convex portions is in a range of about 2.0 μm to about 3.0 μm.

7. The light emitting device of claim 1, wherein the convex portion has at least one of a semispherical shape, a dome shape, and a conical shape.

8. The light emitting device of claim 1, wherein the first semiconductor layer has a discontinuous lower surface.

9. The light emitting device of claim 1, wherein the first semiconductor layer includes an N type semiconductor layer or a P type semiconductor layer.

10. The light emitting device of claim 1, wherein an interval between the dislocations corresponds to an interval between vertexes of the convex portions.

11. The light emitting device of claim 1, wherein a vertex of each convex portion is positioned higher than the buffer layer, and the buffer layer is spaced apart from the vertex of the convex portion.

12. The light emitting device of claim 1,
    wherein a height difference of the rounded surface of the convex portion is calculated by a following equation, $$\text{Rise}(B) = R(\text{Radius}) \times \left(1 - \cos\left[\frac{\left(\frac{C(\text{Chord})}{2}\right)}{R(\text{Radius})}\right]\right) \quad \text{Equation}$$

in which the R represents a radius of a circle having the rounded surface, the C represents a length of a chord of the rounded surface, and the B represents a height difference between a virtual line linking a vertex of the convex portion with a lower end of the convex portion and the rounded surface.

13. The light emitting device of claim 12, wherein the buffer layer is interposed between the convex portions.

14. The light emitting device of claim 12, wherein a lower surface of the first semiconductor layer includes a discontinuous surface.

15. The light emitting device of claim 1, wherein at least one of the dislocations extends to a surface of the second conductive semiconductor layer.

16. A light emitting device comprising:
    a substrate;

a plurality of convex portions protruding from a flat top surface of the substrate;
a first semiconductor layer on the substrate;
an active layer on the first semiconductor layer;
a second conductive semiconductor layer on the active layer; and
a transmissive electrode layer having a plurality of holes on the second conductive semiconductor layer, wherein each hole has a width narrower than a width of each convex portion,
wherein a circumferential surface of each convex portion includes a continuous rounded surface, and a height of the convex portion is about 1.5 µm or less.

17. The light emitting device of claim 16, wherein the convex portion includes a material a same as a material of the substrate,
wherein the height of the convex portion is in a range of about 0.5 µm to about 1.5 µm,
wherein a width of the convex portion is in a range of about 0.5 µm to about 1.5 µm, and
wherein an interval between the convex portions is in a range of about 2.0 µm to about 3.0 µm.

18. The light emitting device of claim 16, wherein the first semiconductor layer includes a buffer layer having a thickness smaller than a height of the convex portion, and
wherein the first semiconductor layer includes a plurality of dislocations having an interval greater than an interval between the convex portions.

19. A light emitting device comprising:
a substrate;
a plurality of convex portions protruding from a flat top surface of the substrate;
a first semiconductor layer on the substrate;
an active layer on the first semiconductor layer; and
a second conductive semiconductor layer on the active layer;
wherein a circumferential surface of each convex portion includes a continuous rounded surface, and a height of the convex portion is about 1.5 µm or less,
wherein a height difference of the rounded surface of the convex portion is calculated by a following equation, $$\text{Rise}(B) = R(\text{Radius}) \times \left(1 - \cos\left[\frac{\left(\frac{C(\text{Chord})}{2}\right)}{R(\text{Radius})}\right]\right) \quad \text{Equation}$$

in which the R represents a radius of a circle having the rounded surface, the C represents a length of a chord of the rounded surface, and the B represents a height difference between a virtual line linking a vertex of the convex portion with a lower end of the convex portion and the rounded surface.

20. The light emitting device of claim 19, wherein the first semiconductor layer includes a buffer layer having a thickness smaller than a height of the convex portion,
further comprising a plurality of dislocations in the first semiconductor layer, wherein an interval between the dislocations corresponds to an interval between the convex portions.

* * * * *